(12) United States Patent
Gunderson et al.

(10) Patent No.: US 11,139,042 B2
(45) Date of Patent: Oct. 5, 2021

(54) CAPACITOR HEALTH CHECK

(71) Applicant: Micron Technology, Inc., Boise, ID (US)

(72) Inventors: Daniel James Gunderson, Longmont, CO (US); Eugene Dvoskin, Broomfield, CO (US); Vehid Suljic, Meridian, ID (US); Brandon R. Nixon, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 13 days.

(21) Appl. No.: 16/721,729

(22) Filed: Dec. 19, 2019

(65) Prior Publication Data

US 2021/0193243 A1  Jun. 24, 2021

(51) Int. Cl.
  *G11C 29/00*  (2006.01)
  *G11C 29/38*  (2006.01)
  *G11C 29/12*  (2006.01)

(52) U.S. Cl.
  CPC ........ *G11C 29/38* (2013.01); *G11C 29/12015* (2013.01)

(58) Field of Classification Search
  None
  See application file for complete search history.

(56) References Cited

U.S. PATENT DOCUMENTS

| | | | |
|---|---|---|---|
| 9,684,460 B1 | 6/2017 | Colgrove et al. | |
| 10,818,370 B1 * | 10/2020 | Wang | G11C 5/141 |
| 2014/0149649 A1 * | 5/2014 | Agarwal | G11C 16/349 |
| | | | 711/103 |
| 2015/0121021 A1 * | 4/2015 | Nakamura | G06F 3/0659 |
| | | | 711/159 |
| 2016/0342189 A1 | 11/2016 | Chiasson et al. | |
| 2016/0351270 A1 * | 12/2016 | Ehrlich | G11C 16/26 |
| 2017/0069356 A1 | 3/2017 | Schmidt et al. | |
| 2018/0173658 A1 | 6/2018 | Kachare et al. | |
| 2018/0188970 A1 | 7/2018 | Liu et al. | |
| 2018/0373450 A1 * | 12/2018 | Ji | G06F 3/0653 |
| 2019/0079702 A1 * | 3/2019 | Yeon | G06F 3/0679 |

OTHER PUBLICATIONS

J. Jang et al., "Refresh-Aware Write Recovery Memory Controller," in IEEE Transactions on Computers, vol. 66, No. 4, pp. 688-701, Apr. 1, 2017, doi: 10.1109/TC.2016.2617333. (Year: 2017).*
ISA/KIPO, "International Search Report & Written Opinion," issued in connection with International Application No. PCT/US2020/063804, dated Mar. 26, 2021 (9 pages).

* cited by examiner

*Primary Examiner* — Daniel F. McMahon
(74) *Attorney, Agent, or Firm* — Holland & Hart LLP

(57) ABSTRACT

Methods, systems, and devices for a capacitor health check are described. A health check manager may detect a trigger for a capacitor health check for a memory sub-system. The health check manager may determine a number of write commands in a set of one or more pending commands for a memory die of the memory sub-system and set a start time for the capacitor health check based on the number of write commands in the set of one or more pending commands. In some cases, the health check manager may perform the capacitor health check in accordance with the start time.

20 Claims, 4 Drawing Sheets

1

CAPACITOR HEALTH CHECK

TECHNICAL FIELD

The following relates generally to a memory sub-system and more specifically to a capacitor health check for a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
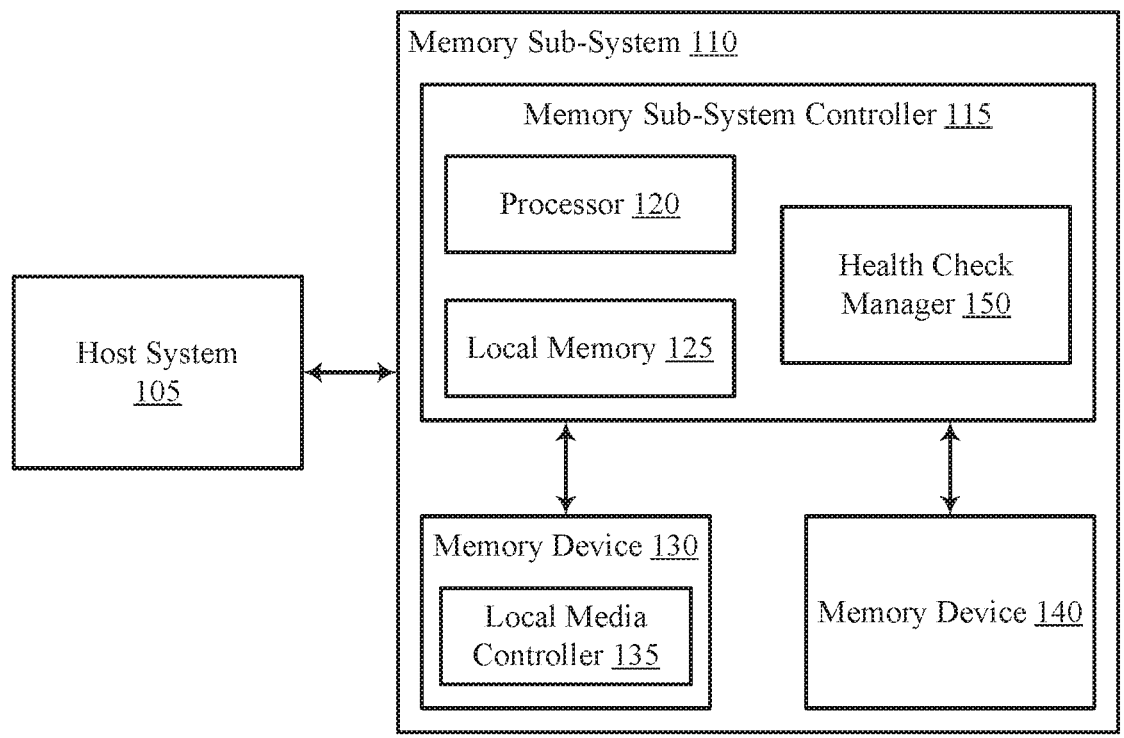
FIG. 1 is an example of a computing system that includes a memory sub-system in accordance with some embodiments of the present disclosure.

Aspects of the present disclosure are directed to a capacitor health check for a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

The memory device can be a non-volatile memory device, which is a package of one or more dice. An example of a non-volatile memory device is a negative-and (NAND) memory device. Other examples of non-volatile memory devices are described below in conjunction with FIG. 1. A memory device can include one or more memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values. Multiple NAND cells can be strung together, and strings can be replicated multiple times within a single block. Each column of cells can be referred to as a "string" and each row can be referred to as a "page." Multiple strings and pages of NAND cells can collectively be referred to as a "block." A block of data can include pages with valid data, and pages that contain no data (e.g., pages that have been previously erased but not yet written). The valid data can then be written (e.g., rewritten) to the memory device (e.g., to a different page of the memory device).

In conventional systems, a memory device can also include one or more storage capacitors. The memory device can store inflight data (e.g., data being written to the memory device) in the storage capacitors. In such cases, the storage capacitors can include enough energy (e.g., capacitance) to store the data written or to be written to the memory device. In some cases, the memory device can experience an unexpected power loss. If an unexpected power loss occurs during a write operation, data can be lost from the memory device which can result in the memory device experiencing a performance loss, increased signaling overhead, and increased processing overhead for performing write operations. In conventional systems, bypassing a health check of the capacitors can decrease performance of the memory dies and the overall memory sub-system through the potential loss of data occurring during a write operation and can also increase power consumption or utilization of other resources to recover the lost data.

Aspects of the present disclosure address the above and other deficiencies by having a health check manager that checks the health of the capacitor or a set of capacitors in a capacitor bank of a memory sub-system. A health check manager can check the health of the capacitors to ensure the capacitors have not depreciated so much as to be unable to store data (e.g., in case of an unexpected power loss). In some cases, the health check manager can perform a capacitor health check to ensure the storage capacitors include enough capacitance if an unexpected power loss occurs during the health check itself.

According to some aspects, a health check manager can delay the health check until the workload is primarily read commands. In some cases, the health check manager can limit the rate of inflight data to be written to the memory device. In such cases, the rate of write commands processed by the memory device can be reduced. The health check manager can monitor the type of work load to determine if the health check can be performed. For example, the health check can be performed when the number of read commands exceeds the number of write commands, the number of write commands is below a threshold value, all of the commands are read commands, or the ratio of read commands to write commands is greater than one. In some examples, performing the health check can be delayed based on the number of write commands exceeding the number of read commands, the number of write commands exceeding the threshold value, if any of the commands are write commands, or if the ratio of write commands to read commands is greater than one.

By monitoring the type of workload being performed by the memory sub-system and performing the health check based on the workload, the overall performance of the memory sub-system can be improved. For example, by performing a capacitance health check after determining that the number of write commands is below a threshold value, the overall efficiency of the memory sub-system can be improved by decreasing the likelihood of experiencing a capacitor short or an unexpected power loss during the health check or during the storage of inflight data at the capacitor bank. Such techniques can result in the memory sub-system experiencing improved read, write, and erase speeds, reduced power consumption, and improved processing times. Additionally, the cost of the memory sub-system can decrease by reducing the number of capacitors and increasing the reliability of the system.

Features of the disclosure are initially described in the context of a computing system as described with reference to FIG. 1. Features of the disclosure are described in the context of method and block diagrams as described with reference to FIGS. 2 and 3. These and other features of the disclosure are further illustrated by and described with reference to a computer system that relates to a capacitor health check as described with reference to FIG. 4.

FIG. 1 is an example of a computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile DIMM (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 105 that is coupled with one or more memory sub-systems 110. In some embodiments, the host system 105 is coupled with different types of memory sub-systems 110. FIG. 1 illustrates one example of a host system 105 coupled with one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 105 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 105 uses the memory sub-system 110, for example, to write data to the memory sub-system 110 and read data from the memory sub-system 110.

The host system 105 can be coupled to the memory sub-system 110 via a physical host interface. Examples of a physical host interface include, but are not limited to, a serial advanced technology attachment (SATA) interface, a peripheral component interconnect express (PCIe) interface, USB interface, Fiber Channel, a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 105 and the memory sub-system 110. The host system 105 can further utilize a non-volatile memory Express (NVMe) interface to access the components (e.g., memory device(s) 130) when the memory sub-system 110 is coupled with the host system 105 by the PCIe interface. The physical host interface can provide an interface for passing control, address, data, and other signals between the memory sub-system 110 and the host system 105. FIG. 1 illustrates a memory sub-system 110 as an example. In general, the host system 105 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device(s) 140) can be, but are not limited to, random access memory (RAM), such as dynamic RAM (DRAM) and synchronous DRAM (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric RAM (FeRAM), magneto RAM (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable ROM (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination of such. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), a digital signal processor (DSP)), or other suitable processor.

The memory sub-system controller 115 can include a processor 120 (e.g., a processing device) configured to execute instructions stored in a local memory 125. In the illustrated example, the local memory 125 of the memory sub-system controller 115 includes an embedded memory configured to store instructions for performing various processes, operations, logic flows, and routines that control operation of the memory sub-system 110, including handling communications between the memory sub-system 110 and the host system 105.

In some examples, the local memory 125 can include memory registers storing memory pointers, fetched data, etc. The local memory 125 can also include ROM for storing micro-code. While the example memory sub-system 110 in FIG. 1 has been illustrated as including the memory sub-system controller 115, in another example of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 105 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 105 via the physical host interface. The host interface circuitry can convert the commands received from the host system into command instructions to access the memory devices 130 as well as convert responses associated with the memory devices 130 into information for the host system 105.

The memory sub-system 110 can also include additional circuitry or components that are not illustrated. In some examples, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some examples, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a health check manager 150 that can determine a number of write commands within a set of pending commands for a memory component. In some cases, the health check manager 150 can set a start time for a health check for a set of capacitors of the memory component. The start time for the health check can be set based on the number of write commands in the set of pending commands. In some examples, if the set of pending commands contains a number of write commands above a threshold, the health check manager 150 can delay the start time for the health check. In other examples, if the set of pending commands contains no write commands (e.g., all of the pending commands are read commands), the health check manager 150 can perform the health check without a delay in the start time.

In some examples, the memory sub-system controller 115 includes at least a portion of the health check manager 150. For example, the memory sub-system controller 115 can include a processor 120 (e.g., a processing device) configured to execute instructions stored in local memory 125 for performing the operations described herein. In some examples, the health check manager 150 is part of the host system 105, an application, or an operating system.

The health check manager 150 can determine that the number of write commands in the set of pending commands exceeds the threshold. In some cases, the health check manager 150 can determine that all of the set of pending commands are read commands and set the start time for the health check based on determining that all of the set of pending commands are read commands. For example, the start time to perform the health check can be immediately after the health check manager 150 determines that all of the set of pending commands are read commands. Further details with regards to the operations of the health check manager 150 are described below.

Figure 2:
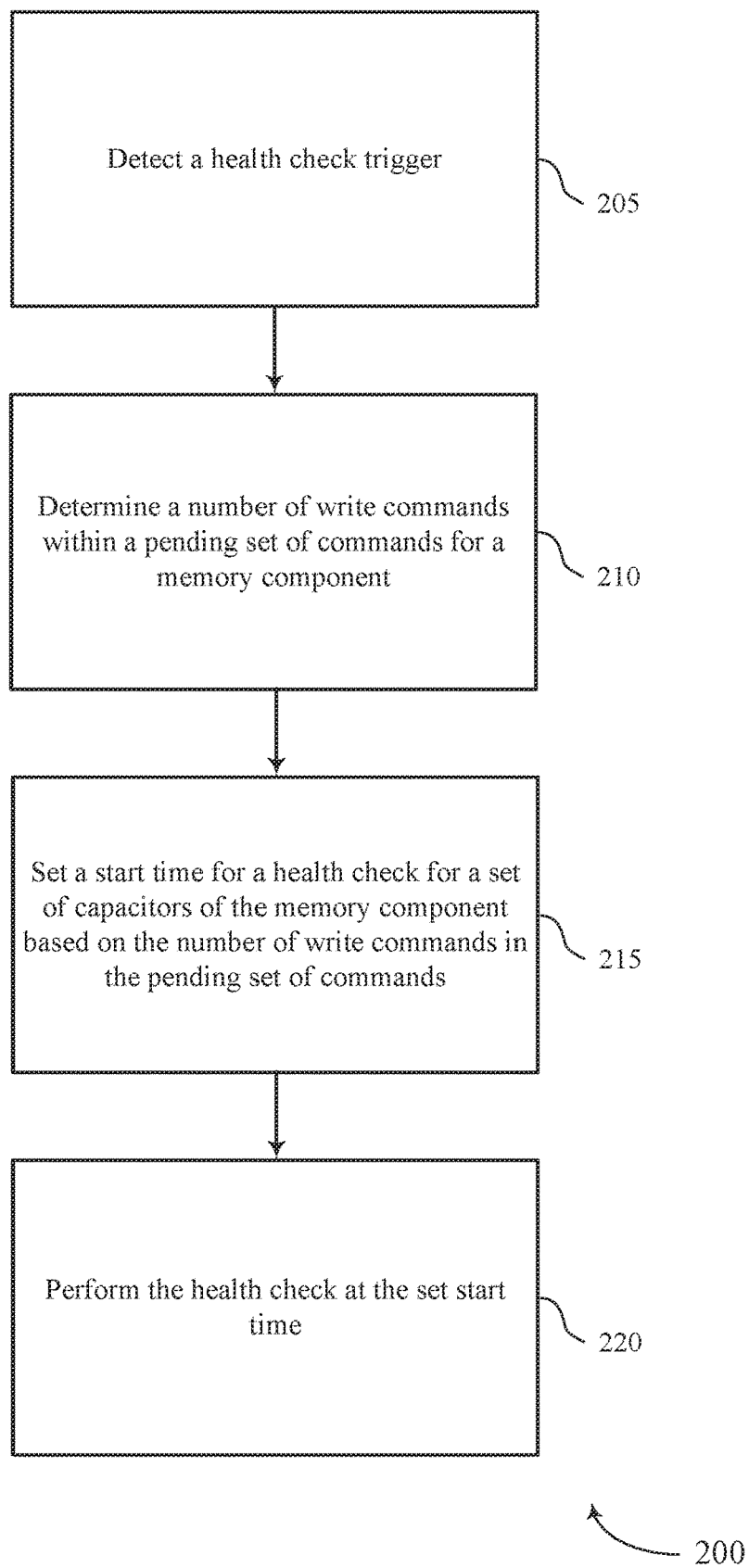
FIG. 2 is a flow diagram of an example method for a capacitor health check in accordance with some embodiments of the present disclosure.

FIG. 2 is a flow diagram of an example method 200 for a capacitor health check in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some examples, the method 200 is performed by the health check manager 150 of FIG. 1. Although shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every example. Other process flows are possible.

At operation 205, the processing device can detect a health check trigger. In some cases, the processing device can detect a trigger for a capacitor health check for a memory sub-system. In some examples, aspects of the operations of 205 can be performed by the health check manager 150 as described with reference to FIG. 1.

At operation 210, the processing device can determine a number of write commands within a pending set of commands for a memory component. The memory component can be included in a memory die of the memory sub-system, where the memory sub-system can undergo the capacitor health check. In some examples, the processing device can determine that the number of write commands in the pending set of commands exceeds a threshold value (e.g., a number of write commands exceeds a number of read commands). If the number of write commands exceeds the threshold value, the processing device can reduce the rate at which write commands are issued for the memory die. In some cases, the rate at which the write commands are issued is reduced is based on a number of resources (e.g., energy, clock cycles, commands) for performing a single write operation for the memory die.

In some examples, the memory component can receive an instruction (e.g., write command) to write to one or more pages of the memory die. For example, the host system can send the instruction to write to one or more pages of the memory die. The processing device can refrain from issuing a write command to write to one or more pages of the memory die based on reducing the rate at which write commands are issued. In some cases, the processing device can determine a number of blocks of data for which write commands are issued based on the number of resources (e.g., energy, clock cycles, commands) for performing the single write operation for the memory die. In other examples, the processing device can determine that the number of write commands is below a threshold value (e.g., a number of read commands exceeds a number of write commands). For example, the processing device can determine that all of the set of pending commands are read commands. In some examples, aspects of the operations of 210 can be performed by the health check manager 150 as described with reference to FIG. 1.

At operation 215, the processing device can set a start time for a health check for a set of capacitors of the memory component based on the number of write commands in the pending set of commands. For example, the processing device can set the start time for the health check based on determining that all of the pending set of commands are read commands (i.e., the number of write commands in the pending set of commands can be zero). In some cases, the processing device can set the start time for the health check based on determining that a number of read commands in the pending set of commands exceeds a number of write commands. In other examples, the processing device can delay the start time for the capacitor health check based at least in part on determining that the number of write commands exceeds the threshold value (i.e., the number of write commands in the pending set of commands can be nonzero). In such cases, the processing device can delay the start time for the health check based on determining that a number of write commands in the pending set of commands exceeds a number of read commands.

In some examples, the method 200 can include determining a ratio of the number of write commands to a number of read commands in the set of pending commands. In such cases, the start time for the health check can be set based on the ratio. In other examples, the method 200 can include determining a ratio of a number of read commands to the number of write commands in the pending set of commands (e.g., the number of read commands exceeds the number of write commands). In such cases, the start time for the health check can be set based on the ratio falling below a threshold ratio (e.g., the number of write commands exceeds the number of read commands). In some examples, aspects of the operations of 215 can be performed by the health check manager 150 as described with reference to FIG. 1.

At operation 220, the processing device can perform the health check at the set start time. For example, the processing device can perform the capacitor health check in accordance with the start time. In some cases, the method 200 can include assigning a number of credits to a write operation associated with the write commands and determining that a number of credits stored in a set of capacitors of the memory sub-system exceeds the number of credits associated with the write commands. In such cases, performing the capacitor health check can be based on determining that the number of credits stored in the set of capacitors exceeds the number of credits associated with the write commands. In some cases, performing the capacitor health check can include verifying a capacitance of a set of capacitors of the memory sub-system based on a drop in voltage applied to the set of capacitors. In some examples, aspects of the operations of 220 can be performed by the health check manager 150 as described with reference to FIG. 1.

Figure 3:
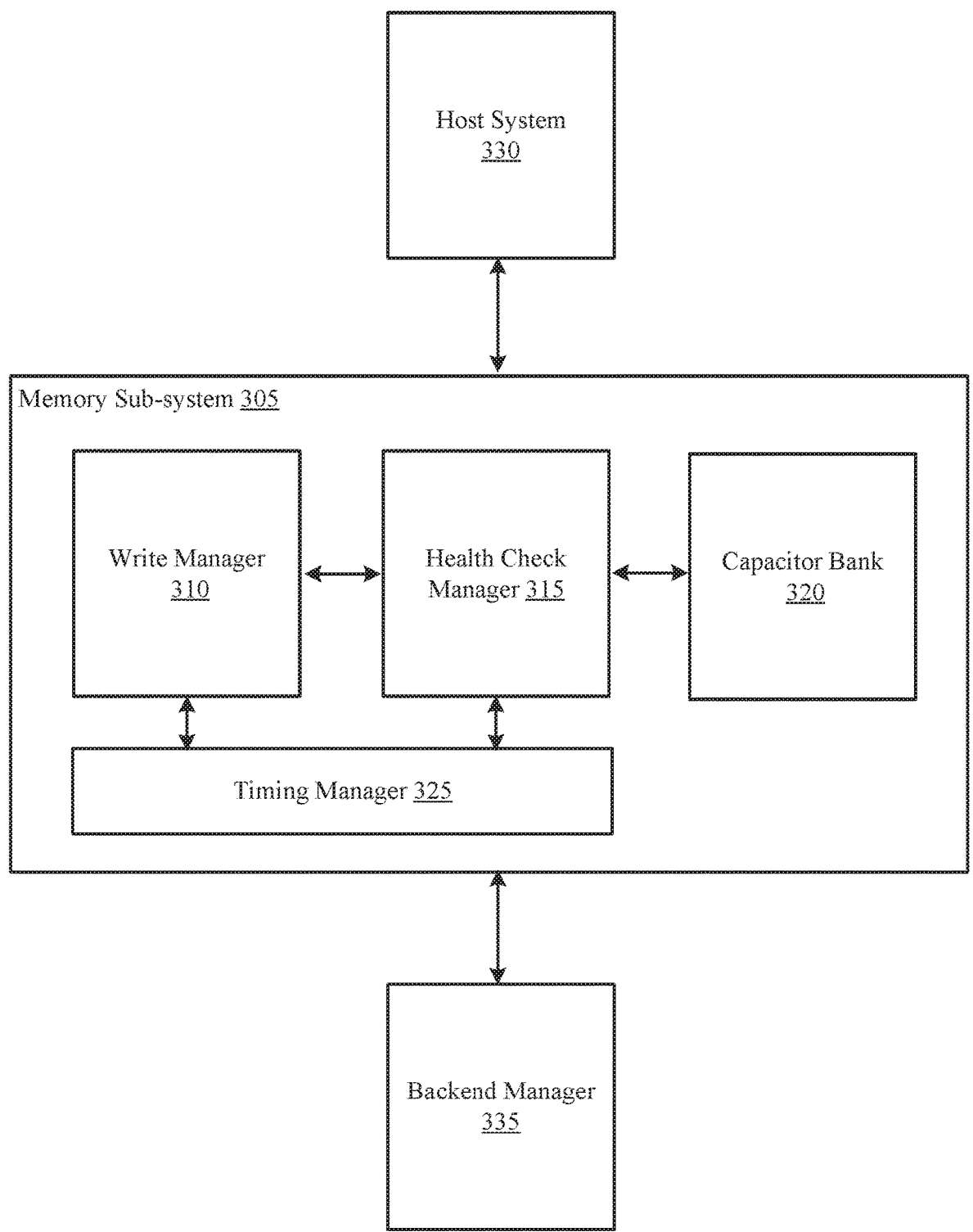
FIG. 3 is an example block diagram of an example system that supports a capacitor health check in accordance with some embodiments of the present disclosure.

FIG. 3 is an example block diagram of an example system that supports a capacitor health check in accordance with some embodiments of the present disclosure. The block diagram 300 can include memory sub-system 305. Memory sub-system 305 can include write manager 310, health check manager 315, capacitor bank 320, and timing manager 325. The block diagram 300 can also include host system 330 and backend manager 335.

The host system 330 can send an instruction to write to one or more pages of a memory die of the memory sub-system. In such cases, the write manager 310 can receive the instruction and process the instruction to write to one or more pages of the memory die. In some cases, the write command can indicate which blocks to write to. The write manager 310 can determine a number of blocks of data for which write commands are issued. The number of blocks can be determined based on an energy calculation (e.g., a number of resources for performing the single write operation). In some cases, the resources can be an example of an amount of energy (e.g., resources utilized), a number of clock cycles, a number of write commands, or a combination thereof.

In some cases, the write manager 310 can accept data from the host system 330 as the host system 330 sends data. However, if the write manager 310 determines how many blocks the write manager 310 can write to, the write manager 310 can throttle the host system 330 to reduce write performance (e.g., stop or slow sending an instruction to write, increasing the write latency) while the health check manager 315 performs the health check. The performance of the host system 330 can be throttled by the write manager 310 responding at reduced speeds to the host system 330. For example, the host system 330 can send the instruction to write, and the write manager 310 can refrain from acknowledging the instruction or can acknowledge the instruction after a delay. In such cases, capacitance of the capacitor bank 320 can be conserved during the health check by refraining from issuing write commands or decreasing the rate at which write commands are issued.

The memory die of the memory sub-system 305 can receive a set of pending commands. In some cases, the write manager 310 can determine a number of write commands within the set of pending commands. Issuing write commands can use an increased amount of energy and resources as compared to issuing a read command. In some cases, an asynchronous power loss (APL) event during a write operation can result in a loss of data when the command is a write command, thereby decreasing the performance of the memory sub-system. Alternatively, an APL event during a read or an erase does not typically result in a loss of data when the command is a read command or an erase command. In such cases, the health check manager 315 can perform a health check during a read operation, an erase operation, or if a number of read commands exceeds a number of write commands. In the case of a write operation, the health check manager 315 can perform a health check during a write operation when a number of write commands are below a threshold. In some cases, performing a health check can increase a risk of data loss in case of an APL event.

The write manager 310 can determine that the number of write commands in the pending set of commands is below the threshold or that the number of write commands exceeds a threshold. In such cases, the write manager 310 can reduce a rate at which the write commands are issued when the number of write commands exceeds the threshold. For example, the write manager 310 can refrain from issuing the write command based on reducing the rate. The rate can be reduced based on a number of resources for performing the single write operation. In some cases, the resources can be an example of an amount of energy (e.g., resources utilized), a number of clock cycles, a number of write commands, or a combination thereof.

In some cases, the write manager 310 can determine a ratio of the number of write commands to a number of read commands and a ratio of the number of read commands to the number of write commands. In some examples, the write manager 310 can determine that all of the pending commands are read commands. In other examples, the write manager 310 can determine that none of the pending commands are read commands (e.g., that one or more commands within the pending commands, if any commands are pending, are write commands).

The start time for the health check can be based on the number of write commands within the pending commands. The write manager 310 and the health check manager 315 can be in communication with the timing manager 325. The timing manager 325 can set the start time for the health check based on the number of commands in the pending commands. In some cases, the timing manager 325 can delay the start time for the health check based on determining that the number of write commands exceeds the threshold (e.g., the start time can be delayed until the number of write commands are below the threshold). In other examples, the timing manager 325 can delay the start time for the health check based on determining that none of the pending claims are read or erase commands (e.g., the pending commands contain write commands). The timing manager 325 can set the start time for the health check if the write manager 310 determines that all of the pending commands are read commands. In such cases, the health check manager 315 can perform the health check after the write manager 310 determines that all of the pending commands are read commands (e.g., immediately after or within a predetermined amount of time after).

In some cases, the timing manager 325 can set the start time based on the ratio of the number of write commands to a number of read commands and a ratio of the number of read commands to the number of write commands. For example, the timing manager 325 can delay the start time if the ratio of the number of write commands to the number of read commands is greater than one. The timing manager 325 can refrain from setting the start time to perform the health check if the ratio of the number of write commands to the number of read commands is less than one. In some cases, the timing manager 325 can delay the start time if the ratio of the number of read commands to the number of write commands is less than one. The timing manager 325 can refrain from setting the start time (e.g., perform the health check) if the ratio of the number of read commands to the number of write commands is greater than one.

The health check manager 315 can be in communication with the write manager 310 and the timing manager 325. The health check manager 315 can detect a trigger for a health check and perform the health check in accordance with the start time. In such cases, the timing manager 325 can send the start time to the health check manager 315 to trigger the health check at the time indicated by the timing manager 325.

In some cases, the health check manager 315 can check the bulk capacitance of the capacitor bank 320 by draining energy from the capacitor bank 320. The health check manager 315 can verify that the capacitance of the capacitor bank 320 exceeds a threshold in case of an APL event. In the case of the APL event, the health check manager 315 can send an error to the host system 330 that indicates an APL event occurred. In such cases, the health check manager 315 can recheck the capacitance of the capacitor bank 320 after the drive power exceeds a threshold. In some cases, the health check manager 315 can add capacitance to the capacitor bank (through the addition of one or more capacitors).

In some cases, to prevent exceeding an amount of power consumed by the memory sub-system 305, the health check manager 315 can perform an algorithm based on a number of credits. In some examples, the health check manager 315 can assign a number of credits to a write operation. For example, each write operation can be assigned a single credit. The health check manager 315 can determine that a number of credits stored in the capacitor bank 320 exceeds the number of credits assigned to the write operation. In such cases, the health check manager 315 can perform the health check based on determining that the number of credits stored in the capacitor bank 320 exceeds the credits assigned to the write operation. If the number of credits available (e.g., stored in the capacitor bank 320) exceeds the number of credits of the write operation, then the memory sub-system 305 can perform the write operation without the amount of power falling below the threshold limit. In some cases, the health check manager 315 can assign a number of credits to a read operation. The amount of credits assigned to the read operation can be less than the amount of credits assigned to the write operation due to an amount of power required to perform the write operation.

To perform the health check and verify the capacitance of the capacitor bank 320, the health check manager 315 can monitor the time it takes for the voltage of the capacitor bank 320 to reach a target voltage after application of a constant current. For example, the health check manager 315 can include a regulator (e.g., regulator circuit) in electronic communication with the capacitor bank 320 that maintains the voltage of the capacitor bank 320 (e.g., the capacitor bank 320 may remain at a constant or steady target voltage during operation). In some cases, a charging circuit that powers the regulator circuit may be disabled, which may trigger a drop in voltage of the capacitor bank 320. For instance, after the charging circuit is disabled, the health check manager 315 supplies a constant current to the capacitor bank 320, thereby enabling a voltage drop of the capacitor bank 320. The health check manager 315 can then measure the time it takes for the voltage of the capacitor bank 320 to reach a target voltage drop. For example, the target voltage drop can be the difference between the initial voltage of the capacitor bank 320 and the voltage of the capacitor bank 320 after the regulator circuit is disabled (e.g., a constant current is applied). The target voltage drop can vary by different amounts based on the initial voltage of the capacitor bank 320. For example, the target voltage drop can be 0.2 volts, 0.3 volts, 0.5 volts, 1 volt, 2 volts, etc.

The health check manager 315 can measure an amount of time for the capacitor bank 320 to reach the target voltage drop. In such cases, the measured time can determine if the capacitor bank 320 is unhealthy or healthy. In some cases, an unhealthy capacitor bank 320 can be indicated by the time it takes to reach the target voltage drop as a relatively fast rate or quicker time as compared to a healthy capacitor bank 320. In other cases, a healthy capacitor bank 320 can be indicated by the time it takes to reach the target voltage drop as a relatively slow rate as compared to an unhealthy capacitor bank 320. In some cases, the voltage drop, as part of the health check, can be initiated by the health check manager 315 internal to the memory sub-system 305 or the voltage drop can be initiated by a component external to the memory sub-system 305.

The capacitor bank 320 can store a voltage where the capacitor bank 320 can be located in multiple locations on the drive of the memory sub-system 305. Each capacitor included in the capacitor bank 320 can include a failure rate. In such cases, an increased amount of capacitors within the capacitor bank 320 can increase a risk of a failure event exponentially. During a health check, the health check manager 315 can check a single capacitor or a subset of capacitors within the capacitor bank 320. In some cases, the capacitor bank 320 can be susceptible to shortages in adverse conditions such as increased heat or APL events. In such cases, the amount of capacitors within the capacitor bank 320 can be reduced based on reducing the capacitance of the memory sub-system, thereby reducing the cost of the memory sub-system and space available to the memory sub-system.

Figure 4:
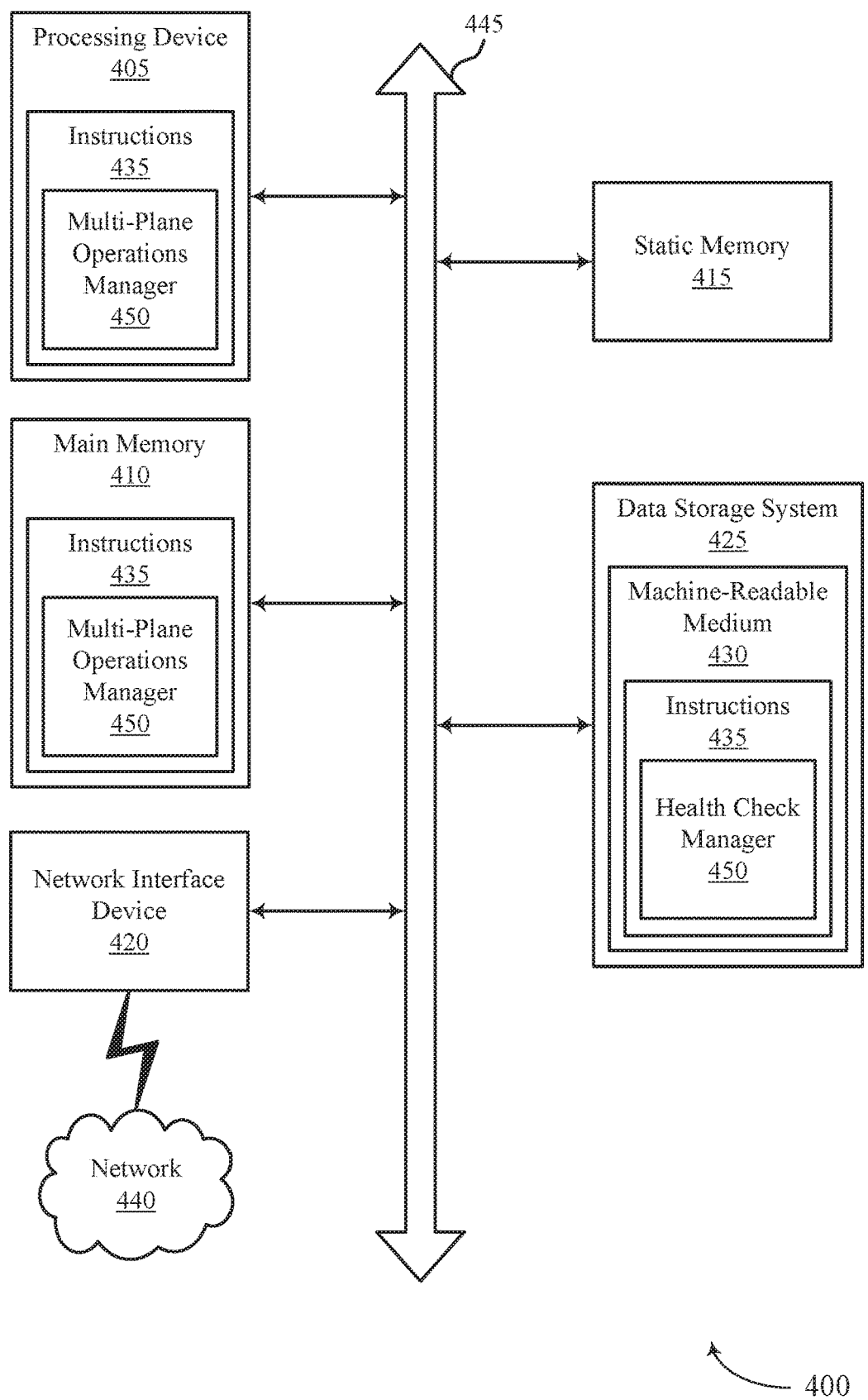
FIG. 4 is an example machine of a computer system in which examples of the present disclosure can operate.

FIG. 4 is an example machine of a computer system 400 in which examples of the present disclosure can operate. The computer system 400 can include a set of instructions, for causing the machine to perform any one or more of the techniques described herein. In some examples, the computer system 400 can correspond to a host system (e.g., the host system 105 described with reference to FIG. 1) that includes, is coupled with, or utilizes a memory sub-system (e.g., the memory sub-system 110 described with reference to FIG. 1) or can be used to perform the operations of a controller (e.g., to execute an operating system to perform operations corresponding to the health check manager 150 described with reference to FIG. 1). In some examples, the machine can be connected (e.g., networked) with other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" can also include any collection of machines that individually or jointly execute a set (or multiple sets) of instructions to perform any one or more of the methodologies discussed herein.

The example computer system 400 can include a processing device 405, a main memory 410 (e.g., ROM, flash memory, DRAM such as SDRAM or Rambus DRAM (RDRAM), etc.), a static memory 415 (e.g., flash memory, static RAM (SRAM), etc.), and a data storage system 425, which communicate with each other via a bus 445.

Processing device 405 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 405 can also be one or more special-purpose processing devices such as an ASIC, an FPGA, a DSP, network processor, or the like. The processing device 405 is configured to execute instructions 435 for performing the operations and steps discussed herein. The computer system 400 can further include a network interface device 420 to communicate over the network 440.

The data storage system 425 can include a machine-readable storage medium 430 (also known as a computer-readable medium) on which is stored one or more sets of instructions 435 or software embodying any one or more of the methodologies or functions described herein. The instructions 435 can also reside, completely or at least partially, within the main memory 410 and/or within the processing device 405 during execution thereof by the computer system 400, the main memory 410 and the processing device 405 also constituting machine-readable storage media. The machine-readable storage medium 430, data storage system 425, and/or main memory 410 can correspond to a memory sub-system.

In one example, the instructions 435 include instructions to implement functionality corresponding to a health check manager 450 (e.g., the health check manager 150 described with reference to FIG. 1). While the machine-readable storage medium 430 is shown as a single medium, the term "machine-readable storage medium" can include a single medium or multiple media that store the one or more sets of instructions. The term "machine-readable storage medium" can also include any medium that is capable of storing or encoding a set of instructions for execution by the machine and that cause the machine to perform any one or more of the methodologies of the present disclosure. The term "machine-readable storage medium" can include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some examples, a machine-readable (e.g., computer-readable) medium includes a machine (e.g., a computer) readable storage medium such as ROM, RAM, magnetic disk storage media, optical storage media, flash memory components, etc.

In the foregoing specification, examples of the disclosure have been described with reference to specific example examples thereof. It will be evident that various modifications can be made thereto without departing from the broader spirit and scope of examples of the disclosure as set forth in the following claims. The specification and drawings are, accordingly, to be regarded in an illustrative sense rather than a restrictive sense.

What is claimed is:

1. A method comprising:
   detecting a trigger for a capacitor health check for a memory sub-system;
   determining a number of write commands in a set of one or more pending commands for a memory die of the memory sub-system;
   setting a start time for the capacitor health check based at least in part on the number of write commands in the set of one or more pending commands; and
   performing the capacitor health check in accordance with the start time.

2. The method of claim 1, further comprising:
   determining that the number of write commands in the set of one or more pending commands exceeds a threshold value; and
   delaying the start time for the capacitor health check based at least in part on determining that the number of write commands exceeds the threshold value.

3. The method of claim 2, further comprising:
   reducing a rate at which write commands are issued for the memory die based at least in part on determining that the number of write commands exceeds the threshold value.

4. The method of claim 3, further comprising:
   receiving, from a host device, an instruction to write to one or more pages of the memory die; and
   refraining from issuing a write command to write to the one or more pages of the memory die based at least in part on reducing the rate at which write commands are issued.

5. The method of claim 3, wherein the rate at which the write commands are issued is reduced based at least in part on a number of resources for performing a single write operation for the memory die.

6. The method of claim 5, further comprising:
   determining a number of blocks of data for which the write commands are issued based at least in part on the number of resources for performing the single write operation for the memory die.

7. The method of claim 1, further comprising:
   determining that the number of write commands is below a threshold value.

8. The method of claim 1, further comprising:
   assigning a number of credits to a write operation associated with the write commands, wherein the number of credits associated with the write commands corresponds to an amount of power consumption by the memory sub-system during the write operation; and
   determining that a number of credits associated with an amount of power stored in a set of capacitors of the memory sub-system exceeds the number of credits associated with the write commands, wherein performing the capacitor health check is based at least in part on determining that the number of credits associated with the amount of power stored in the set of capacitors exceeds the number of credits associated with the write commands.

9. The method of claim 1, wherein performing the capacitor health check comprises:
   verifying a capacitance of a set of capacitors of the memory sub-system based at least in part on a drop in voltage applied to the set of capacitors.

10. A system comprising:
    a plurality of memory components; and
    a processing device, operatively coupled with the plurality of memory components, to:
    determine a number of write commands within a set of pending commands for a memory component of the plurality of memory components;
    set a start time for a health check for a set of capacitors of the memory component based at least in part on the number of write commands in the set of pending commands; and
    perform the health check in accordance with the start time.

11. The system of claim 10, further comprising:
the processing device to:
determine a ratio of the number of write commands to a number of read commands in the set of pending commands, wherein the start time for the health check is set based at least in part on the ratio.

12. The system of claim 10, further comprising:
the processing device to:
determine a ratio of a number of read commands to the number of write commands in the set of pending commands, wherein the start time for the health check is set based at least in part on the ratio falling below a threshold ratio.

13. The system of claim 10, further comprising:
the processing device to:
determine that all of the set of pending commands are read commands; and
set the start time for the health check based at least in part on determining that all of the set of pending commands are read commands.

14. A non-transitory computer-readable storage medium comprising instructions that, when executed by a processing device, cause the processing device to:
detect a trigger for a capacitor health check for a memory sub-system;
determine a number of write commands in a set of one or more pending commands for a memory die of the memory sub-system;
set a start time for the capacitor health check based at least in part on the number of write commands in the set of one or more pending commands; and
perform the capacitor health check in accordance with the start time.

15. The non-transitory computer-readable storage medium of claim 14, wherein the processing device is further to:
determine that the number of write commands in the set of one or more pending commands exceeds a threshold value; and
delay the start time for the capacitor health check based at least in part on determining that the number of write commands exceeds the threshold value.

16. The non-transitory computer-readable storage medium of claim 15, wherein the processing device is further to:
reduce a rate at which write commands are issued for the memory die based at least in part on determining that the number of write commands exceeds the threshold value.

17. The non-transitory computer-readable storage medium of claim 16, wherein the processing device is further to:
receive, from a host device, an instruction to write to one or more pages of the memory die; and
refrain from issuing a write command to write to the one or more pages of the memory die based at least in part on reducing the rate at which write commands are issued.

18. The non-transitory computer-readable storage medium of claim 16, wherein the rate at which the write commands are issued is reduced based at least in part on a number of resources for performing a single write operation for the memory die.

19. The non-transitory computer-readable storage medium of claim 18, wherein the processing device is further to:
determine a number of blocks of data for which write commands are issued based at least in part on the number of resources for performing the single write operation for the memory die.

20. The non-transitory computer-readable storage medium of claim 14, wherein the processing device is further to:
determine that the number of write commands is below a threshold value.

* * * * *